United States Patent
Kaneko et al.

(10) Patent No.: US 11,881,674 B2
(45) Date of Patent: Jan. 23, 2024

(54) SURFACE-EMITTING SEMICONDUCTOR LIGHT-EMITTING DEVICE

(71) Applicant: KABUSHIKI KAISHA TOSHIBA, Tokyo (JP)

(72) Inventors: Kei Kaneko, Yokohama (JP); Tsutomu Kakuno, Fujisawa (JP); Rei Hashimoto, Edogawa (JP); Shinji Saito, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 138 days.

(21) Appl. No.: 17/652,778

(22) Filed: Feb. 28, 2022

(65) Prior Publication Data

US 2023/0027967 A1    Jan. 26, 2023

(30) Foreign Application Priority Data

Jul. 21, 2021    (JP) .................. 2021-120296

(51) Int. Cl.
*H01S 5/11*    (2021.01)
*H01S 5/183*    (2006.01)
(Continued)

(52) U.S. Cl.
CPC ............ *H01S 5/11* (2021.01); *H01S 5/04253* (2019.08); *H01S 5/04256* (2019.08);
(Continued)

(58) Field of Classification Search
CPC .... H01S 5/18347; H01S 5/04256; H01S 5/11; H01S 5/185; H01S 5/187; H01S 5/3401; H01S 5/3402
See application file for complete search history.

(56) References Cited

U.S. PATENT DOCUMENTS 8,699,539 B2 *    4/2014    Numata ............... H01S 5/11
                                                372/45.01
2006/0093008 A1    5/2006    Mochizuki
                      (Continued)

FOREIGN PATENT DOCUMENTS

JP    2006-332595 A    12/2006
JP    2006-344667 A    12/2006
            (Continued)

*Primary Examiner* — Tod T Van Roy
*Assistant Examiner* — Sarah Michelle Bulger
(74) *Attorney, Agent, or Firm* — Oblon, McClelland, Maier & Neustadt, L.L.P.

(57) ABSTRACT

A surface-emitting semiconductor light-emitting device includes a first semiconductor layers, an active layer on the first semiconductor layer, a photonic crystal layer on the active layer and a second semiconductor layer on the photonic crystal layer. The photonic crystal layer include first protrusions in a first region and second protrusions in a second region. A spacing of adjacent first protrusions is greater than a spacing of adjacent second protrusions. The second semiconductor layer includes a first layer and a second layer on the first layer. The first layer covers first and second protrusions so that a first space remains between the adjacent first protrusions. The first layer includes a first portion provided between the adjacent second protrusions. The second layer includes a second portion provided between the adjacent first protrusions. The first space between the adjacent first protrusions is filled with the second portion of the second layer.

20 Claims, 5 Drawing Sheets

(51) Int. Cl.
*H01S 5/042* (2006.01)
*H01S 5/30* (2006.01)
*H01S 5/34* (2006.01)

(52) U.S. Cl.
CPC ...... *H01S 5/18319* (2013.01); *H01S 5/18347* (2013.01); *H01S 5/3013* (2013.01); *H01S 5/3419* (2013.01); *H01S 5/3401* (2013.01)

(56) References Cited

U.S. PATENT DOCUMENTS

| | | | |
|---|---|---|---|
| 2006/0245464 A1 | 11/2006 | Hori et al. | |
| 2015/0357794 A1* | 12/2015 | Tsuji | H01S 5/22 372/45.012 |
| 2016/0308331 A1* | 10/2016 | Belkin | H01S 5/0208 |
| 2019/0074663 A1* | 3/2019 | Saito | H01S 5/1215 |
| 2019/0148915 A1* | 5/2019 | Saito | H01S 5/3401 372/45.01 |
| 2019/0267775 A1* | 8/2019 | Noda | H01S 5/3063 |
| 2021/0226412 A1* | 7/2021 | Hirose | H01S 5/185 |
| 2023/0139244 A1* | 5/2023 | Kuo | H01S 5/11 372/92 |

FOREIGN PATENT DOCUMENTS

| | | |
|---|---|---|
| JP | 4027392 B2 | 12/2007 |
| JP | 2009130110 A * | 6/2009 |
| JP | 4602701 B2 | 12/2010 |
| JP | 2019-47023 A | 3/2019 |
| TW | M615662 U * | 5/2021 |

\* cited by examiner

SURFACE-EMITTING SEMICONDUCTOR LIGHT-EMITTING DEVICE

CROSS-REFERENCE TO RELATED APPLICATIONS

This application is based upon and claims the benefit of priority from Japanese Patent Application No. 2021-120296, filed on Jul. 21, 2021; the entire contents of which are incorporated herein by reference.

FIELD

Embodiments relate to a surface-emitting semiconductor light-emitting device.

BACKGROUND

It is desirable to improve the light output of the surface-emitting semiconductor light-emitting device.

DETAILED DESCRIPTION

Figure 1A:
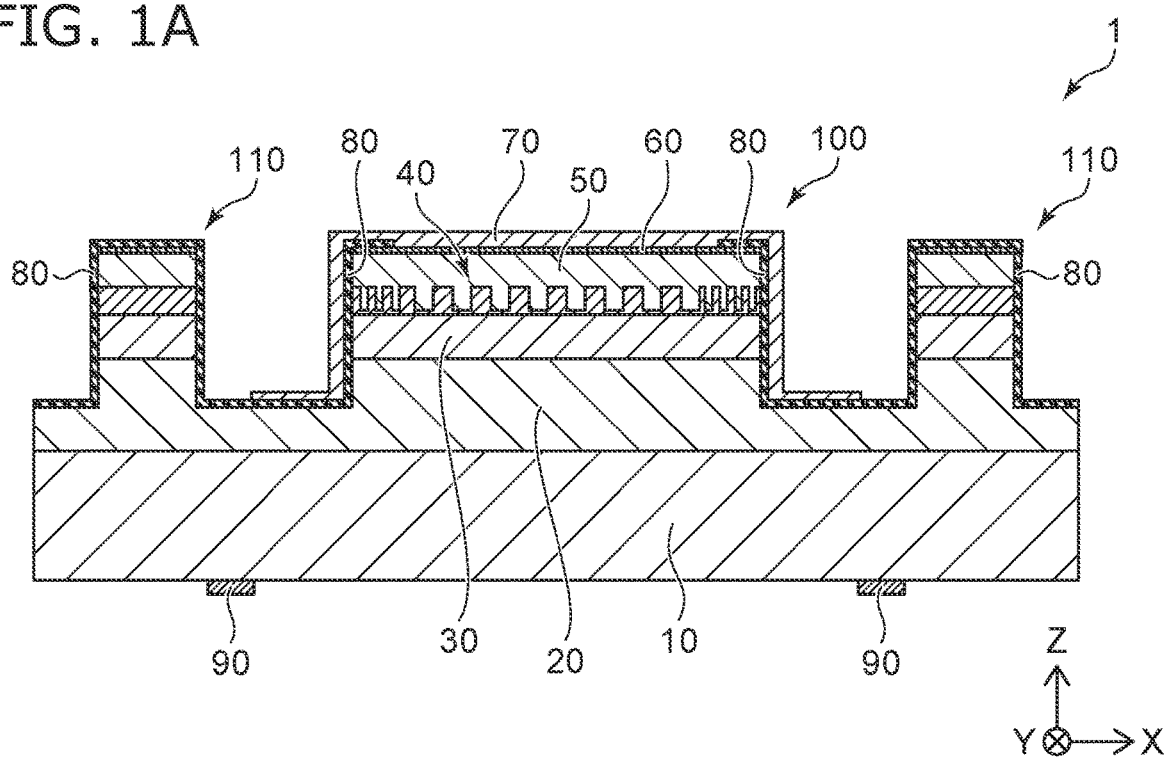
FIGS. 1A and 1B are schematic cross-sectional views showing a surface-emitting semiconductor light-emitting device according to an embodiment.

According to one embodiment, a surface-emitting semiconductor light-emitting device includes a first semiconductor layer of a first conductivity type, an active layer, a photonic crystal layer and a second semiconductor layer of the first conductivity type. The active layer is provided on the first semiconductor layer. The photonic crystal layer is provided on the active layer. The second semiconductor layer is provided on the photonic crystal layer. The photonic crystal layer includes a first region and a second region surrounding the first region. The photonic crystal layer includes a plurality of protrusions arranged along an upper surface of the active layer. The plurality of protrusions include a plurality of first protrusions in the first region and a plurality of second protrusions in the second region. A first spacing of adjacent first protrusions among the plurality of first protrusions is greater than a second spacing of adjacent second protrusions among the plurality of second protrusions. The second semiconductor layer includes a first layer and a second layer on the first layer. A first-conductivity-type impurity concentration in the first layer is less than a first-conductivity-type impurity concentration in the second layer. The first layer covers the plurality of protrusions. The first layer covers the plurality of first protrusions so that a first space remains between the adjacent first protrusions. The first layer includes a first portion provided between the adjacent second protrusions. The first portion of the first layer has a width in a first direction along the upper surface of the active layer. The width of the first portion is same as the second spacing between the second protrusions adjacent in the first direction. The second layer includes a second portion provided between the adjacent first protrusions. The first space between the adjacent first protrusions is filled with the second portion of the second layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
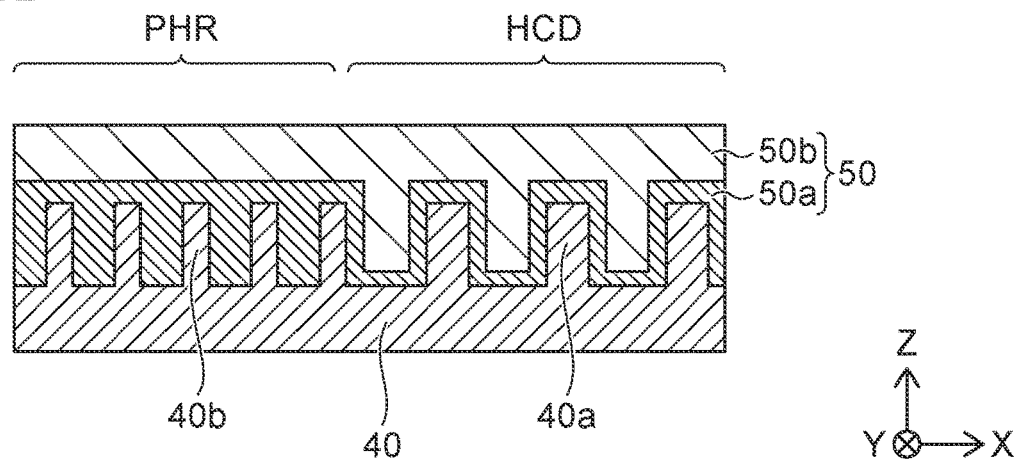

FIGS. 1A and 1B are schematic cross-sectional views showing a surface-emitting semiconductor light-emitting device according to an embodiment. The surface-emitting semiconductor light-emitting device 1 is, for example, a surface-emitting QCL (Quantum Cascade Laser).

As shown in FIG. 1A, the surface-emitting semiconductor light-emitting device 1 includes a semiconductor substrate 10, a first semiconductor layer 20, an active layer 30, a photonic crystal layer 40, a second semiconductor layer 50, a third semiconductor layer 60, a front electrode 70, an insulating film 80, and a back electrode 90. The surface-emitting semiconductor light-emitting device 1 further includes a light-emitting region 100 and an outer wall region 110. The outer wall region 110 surrounds the light-emitting region 100 (see FIG. 2A).

The semiconductor substrate 10 is, for example, an n-type InP substrate. The semiconductor substrate 10 may be an n-type GaAs substrate. Hereinbelow, the semiconductor substrate is described as an InP substrate. When a GaAs substrate is used, a semiconductor crystal that provides lattice matching with GaAs is used, or a buffer layer is provided to relax the lattice mismatch between the semiconductor substrate and the semiconductor layer.

The first semiconductor layer 20 is provided on the semiconductor substrate 10. The first semiconductor layer 20 is, for example, an n-type InP layer. A semiconductor crystal layer that serves as a buffer layer may be provided between the semiconductor substrate 10 and the first semiconductor layer 20.

The active layer 30 is provided on the first semiconductor layer 20. The active layer 30 has, for example, a quantum well structure that allows intersubband transitions of carriers. The active layer 30 includes, for example, an n-type Group III-V compound semiconductor crystal doped with silicon and emits light due to the intersubband transitions of electrons.

The active layer 30 includes, for example, a quantum well structure in which quantum well layers and barrier layers are alternately stacked in a direction orthogonal to the upper surface of the first semiconductor layer 20, e.g., a Z-direction. The quantum well layer includes, for example, an InGaAs crystal; and the barrier layer includes, for example, an AlInAs crystal.

The photonic crystal layer 40 is provided on the active layer 30. The photonic crystal layer 40 includes a specific periodic structure and controls the propagation direction of the light emitted from the active layer 30. The photonic crystal layer includes, for example, an InGaAs crystal.

The second semiconductor layer 50 is provided on the photonic crystal layer 40. The second semiconductor layer 50 is, for example, an n-type InP layer. The second semiconductor layer 50 includes, for example, a stacked structure that includes a first layer 50a and a second layer 50b.

The third semiconductor layer 60 is provided on the second semiconductor layer 50. The third semiconductor layer 60 is, for example, an n-type InGaAs layer. The third semiconductor layer 60 is provided as, for example, a contact layer. The third semiconductor layer 60 reduces the contact resistance of the front electrode 70.

The front electrode 70 is provided on the third semiconductor layer 60. The front electrode 70 reflects the light radiated from the active layer 30. Thereby, the propagation direction of the light traveling from the active layer 30 toward the front electrode 70 can be reversed toward the semiconductor substrate 10. The front electrode 70 includes, for example, gold (Au).

As shown in FIG. 1A, the light-emitting region 100 includes a mesa structure that includes the first semiconductor layer 20, the active layer 30, the photonic crystal layer 40, the second semiconductor layer 50, and the third semiconductor layer 60. The insulating film 80 covers the side surface of the mesa structure. The insulating film 80 is, for example, a silicon oxide film.

The outer wall region 110 includes semiconductor layers of the same stacked structure as the light-emitting region 100. The mesa structure of the light-emitting region 100 is formed by selectively removing the semiconductor layers between the light-emitting region 100 and the outer wall region 110.

The first semiconductor layer 20 has a portion exposed between the light-emitting region 100 and the outer wall region 110. The insulating film 80 covers the side surface of the mesa structure that includes the light-emitting region 100, a portion of the first semiconductor layer 20, and the outer wall region 110.

The front electrode 70 covers the side surface of the mesa structure and a portion of the first semiconductor layer 20 with the insulating film 80 interposed. The light that travels externally through the side surface of the mesa structure also is reflected by the front electrode 70 and returned to the interior of the light-emitting region 100.

The back electrode 90 is provided on the back surface of the semiconductor substrate 10 at the side opposite to the light-emitting region 100. The back electrode 90 includes, for example, a stacked structure of a titanium (Ti) layer and a gold (Au) layer. The Ti layer is provided between the semiconductor substrate 10 and the Au layer.

In the surface-emitting semiconductor light-emitting device 1, the carriers (electrons) are injected into the active layer by a drive current that flows between the front electrode 70 and the back electrode 90. The active layer 30 emits QCL light due to the light generated by energy relaxation of the carriers in the quantum wells and stimulated emission due to the light guided along the active layer 30. The QCL light is externally radiated from the back surface of the semiconductor substrate 10 by the photonic crystal layer 40. The wavelength of the QCL light is, for example, 4.5 micrometers (µm).

FIG. 1B is a partial cross-sectional view showing the photonic crystal layer 40. The photonic crystal layer 40 includes, for example, multiple protrusions 40a and 40b that are periodically arranged, and acts as a two-dimensional diffraction grating.

The multiple protrusions 40a are provided in a high current density region HCD. The multiple protrusions 40b are provided in a peripheral region PHR that surrounds the high current density region HCD. The protrusions 40a and 40b have, for example, a circular columnar or triangular prism shape.

The second semiconductor layer 50 is provided on the photonic crystal layer 40. The second semiconductor layer 50 includes a stacked structure of the first and second layers 50a and 50b. The first layer 50a is provided between the photonic crystal layer 40 and the second layer 50b. The second layer 50b includes a first-conductivity-type impurity with a higher concentration than a concentration of a first-conductivity-type impurity in the first layer 50a. The concentration of the first-conductivity-type impurity of the first layer 50a is, for example, less than $1\times10^{15}$ cm$^{-3}$. The concentration of the first-conductivity-type impurity of the second layer 50b is, for example, not less than $1\times10^{17}$ cm$^{-3}$.

The first layer 50a covers the protrusions 40a and 40b of the photonic crystal layer 40. The first layer 50a covers the protrusions 40a so that a space remains between the adjacent protrusions 40a. Also, the first layer 50a includes a portion that is filled between the adjacent protrusions 40b. The width of the portion filled between the adjacent protrusions 40b is equal to the spacing of the adjacent protrusions 40b.

The second layer 50b is provided on the first layer 50a and covers the protrusions 40a and 40b. The second layer 50b includes a portion that is filled into the space between the adjacent protrusions 40a. The width of the portion filled into the space between the adjacent protrusions 40a is equal to the width of the space between the adjacent protrusions 40a.

In other words, a portion of the second semiconductor layer 50 that includes a first-conductivity-type impurity with a higher concentration extends between the adjacent protrusions 40a; and such a portion is not provided between the adjacent protrusions 40b. Therefore, the electrical resistance between the adjacent protrusions 40a is low in the high current density region HCD. On the other hand, in the peripheral region PHR, another portion of the second semiconductor layer 50 that includes the first-conductivity-type impurity with a lower concentration is filled between the adjacent protrusions 40b; and the electrical resistance between the adjacent protrusions 40b is high. As a result, in the surface-emitting semiconductor light-emitting device 1, the drive current flows mainly in the high current density region HCD; and the drive current is suppressed in the peripheral region PHR.

The photonic crystal layer 40 acts as a two-dimensional diffraction grating due to the refractive index difference between the material of the second semiconductor layer 50 and the material of the protrusions 40a and 40b. The photonic crystal layer 40 has the functions of selecting the resonant wavelength of the laser light and controlling the emission angle of the laser light.

The photonic crystal layer 40 causes the laser light to be emitted in a direction that is substantially perpendicular to the boundary between the active layer 30 and the first semiconductor layer 20. For example, "substantially perpendicular" means that the angle of the propagation direction of the laser light with respect to the boundary between the active layer 30 and the first semiconductor layer 20 is not less than 81° and not more than 99°.

The periodic structure of the photonic crystal layer 40 is designed so that light resonates with a desired wavelength; and laser oscillation occurs in the active layer 30. By providing the photonic crystal layer 40, the current injection provides a difference in the current densities of the high region HCD and the peripheral region PHR. In the active layer 30, the imaginary part of the complex refractive index is changed thereby, increasing the Q-factor of the optical resonance. In other words, it is possible to increase the intensity of the laser light radiated from the active layer 30.

Figure 2A:
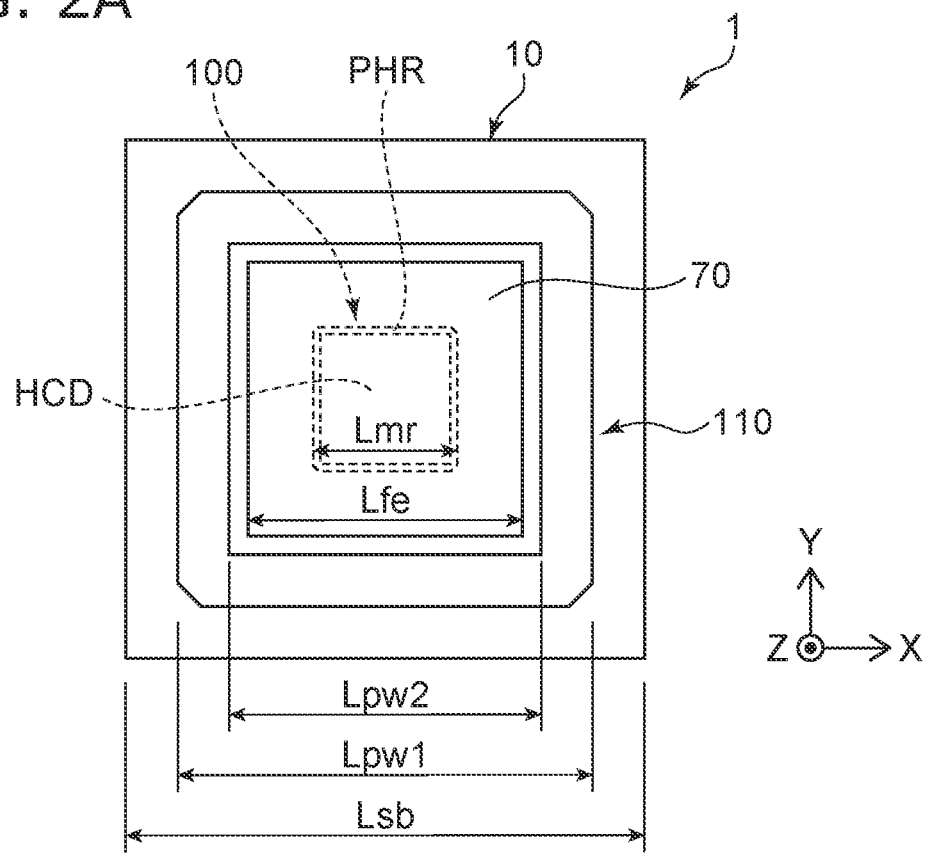
FIGS. 2A and 2B are schematic plan views showing the surface-emitting semiconductor light-emitting device according to the embodiment.
Figure 2B:
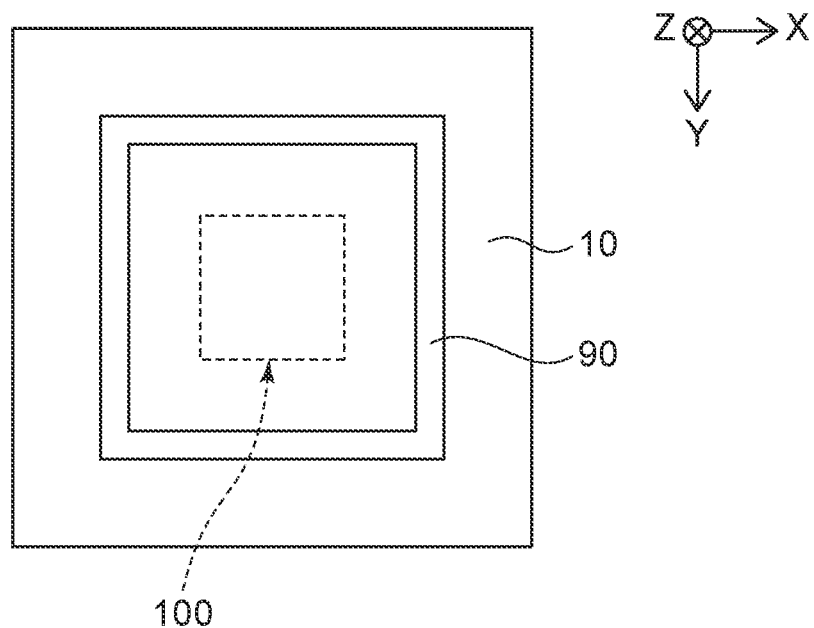

FIGS. 2A and 2B are schematic plan views showing the surface-emitting semiconductor light-emitting device 1 according to the embodiment. FIG. 2A is a plan view showing the front side of the surface-emitting semiconductor light-emitting device 1. FIG. 2B is a plan view showing the backside of the surface-emitting semiconductor light-emitting device 1.

As shown in FIG. 2A, the light-emitting region 100 is provided at the center of the semiconductor substrate 10 (i.e., the laser chip). The high current density region HCD is provided at the center of the light-emitting region 100; and the peripheral region PHR surrounds the high current density region HCD along the outer edge of the light-emitting region 100.

The semiconductor substrate 10 and the light-emitting region 100 are, for example, square. The shape of the light-emitting region 100 is not limited to the example. The light-emitting region 100 may be, for example, circular. A size Lsb of the semiconductor substrate 10 is, for example, 2000 µm. A size Lmr of the light-emitting region 100 is, for example, 560 µm.

The outer wall region 110 surrounds the light-emitting region 100. A size Lpw1 of the outer side of the outer wall region 110 is, for example, 1600 µm. A size Lpw2 of the inner side of the outer wall region 110 is, for example, 1200 µm.

The front electrode 70 is located inward of the outer wall region 110 and covers the light-emitting region 100. The front electrode 70 has, for example, a square planar shape. A size Lfe of the front electrode 70 is, for example, 1000 µm.

As shown in FIG. 2B, for example, the back electrode 90 is provided with a square frame shape. The light-emitting region 100 is provided at a position that corresponds to the center of the back electrode 90 at the front side of the semiconductor substrate 10. The back electrode 90 is not limited to the example. It is sufficient for the back electrode 90 to have a configuration that does not shield the laser light emitted outside from the light-emitting region 100 via the back surface of the semiconductor substrate 10.

Figure 3A:
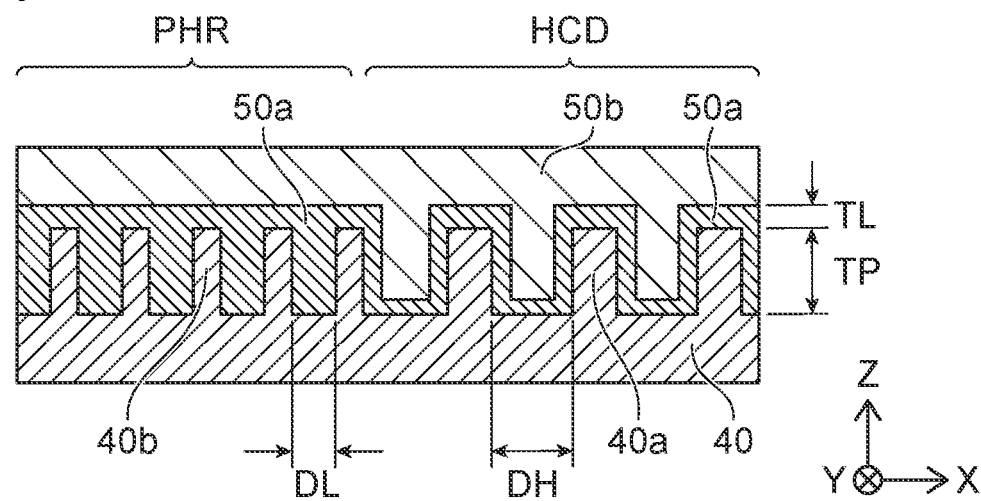
FIGS. 3A to 3C are schematic views showing the photonic crystal layer of the surface-emitting semiconductor light-emitting device according to the embodiment.
Figure 3B:
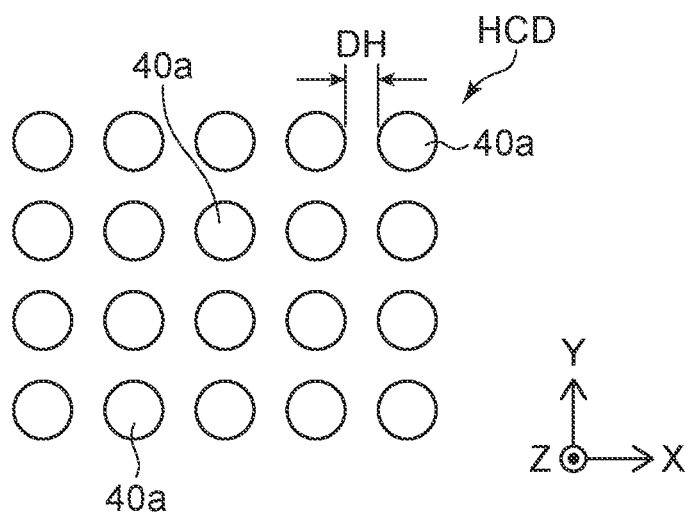
Figure 3C:
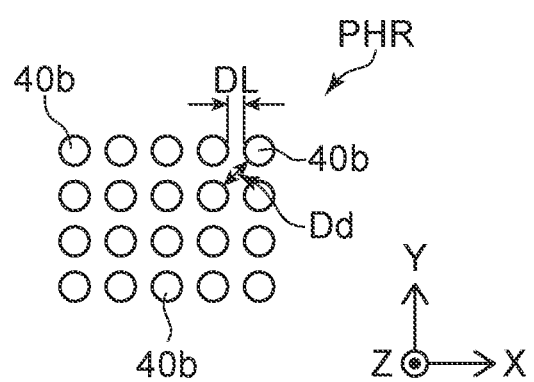

FIGS. 3A to 3C are schematic views showing the photonic crystal layer 40 of the surface-emitting semiconductor light-emitting device 1 according to the embodiment. FIG. 3A is a cross-sectional view showing the photonic crystal layer 40. FIG. 3B is a plan view illustrating the arrangement of the protrusions 40a in the high current density region HCD. FIG. 3C is a plan view illustrating the arrangement of the protrusions 40b in the peripheral region PHR.

As shown in FIG. 3A, a height TP in the Z-direction of the protrusions 40a and 40b is, for example, 0.8 to 2 µm. In the example, TP=0.85 µm. A spacing DH of the adjacent protrusions 40a in the high current density region HCD is, for example, 0.1 to 0.5 µm. In the example, DH=0.45 µm. A spacing DL of the adjacent protrusions 40b in the peripheral region PHR is, for example, 0.2 µm.

The first layer 50a of the second semiconductor layer 50 has a layer thickness TL of, for example, 0.1 to 0.8 µm in the Z-direction at the portion provided on the top portion of the protrusion 40a. In the example, TL=0.13 µm. Thereby, the first layer 50a covers the top portion and the side surface of the protrusion 40a so that a space remains between the adjacent protrusions 40a. On the other hand, the first layer 50a is filled so that a space does not remain between the adjacent protrusions 40b.

As shown in FIG. 3B, the protrusion 40a is, for example, circular columnar. The spacing DH of the adjacent protrusions 40a is, for example, the minimum spacing in the X-Y plane. When the multiple protrusions 40a are arranged at uniform spacing in the X-direction and the Y-direction, the adjacent protrusions 40a in the X-direction and the Y-direction has the spacing DH.

As shown in FIG. 3C, the protrusion 40b is, for example, circular columnar. The spacing DL of the adjacent protrusions 40b is, for example, the minimum spacing in the X-Y plane. When the multiple protrusions 40b are arranged at uniform spacing in the X-direction and the Y-direction, the adjacent protrusions 40b have the spacing DL in the X-direction and the Y-direction.

The multiple protrusions 40b are arranged with, for example, a spacing Dd in the diagonal direction in the X-Y plane. When the spacing Dd is greater than the spacing DL in the X-direction and the Y-direction and the space between the adjacent protrusions 40b is filled with the first layer 50a of the second semiconductor layer 50, the space is preferably filled without a remaining space in the diagonal direction.

Figure 4A:
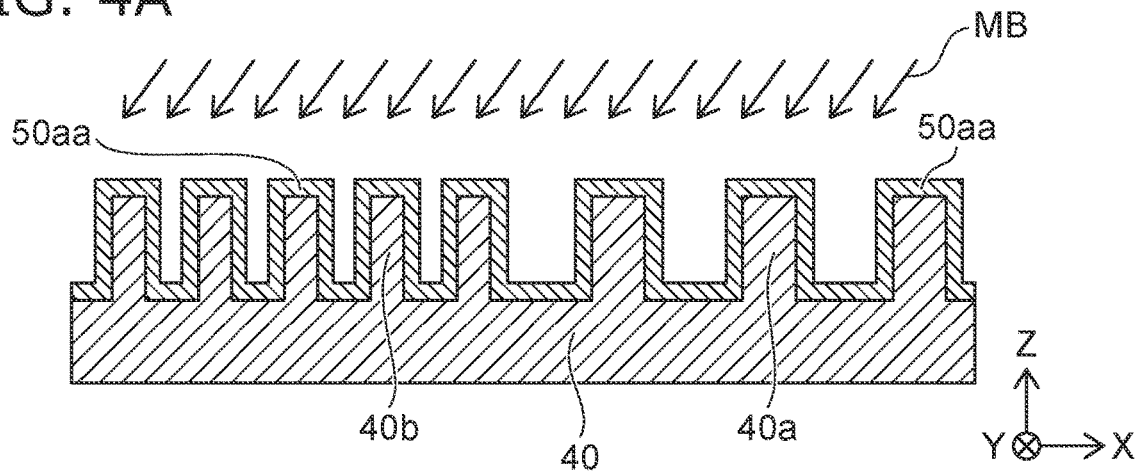
FIGS. 4A to 4C are schematic cross-sectional views showing manufacturing processes of the surface-emitting semiconductor light-emitting device according to the embodiment.
Figure 4B:
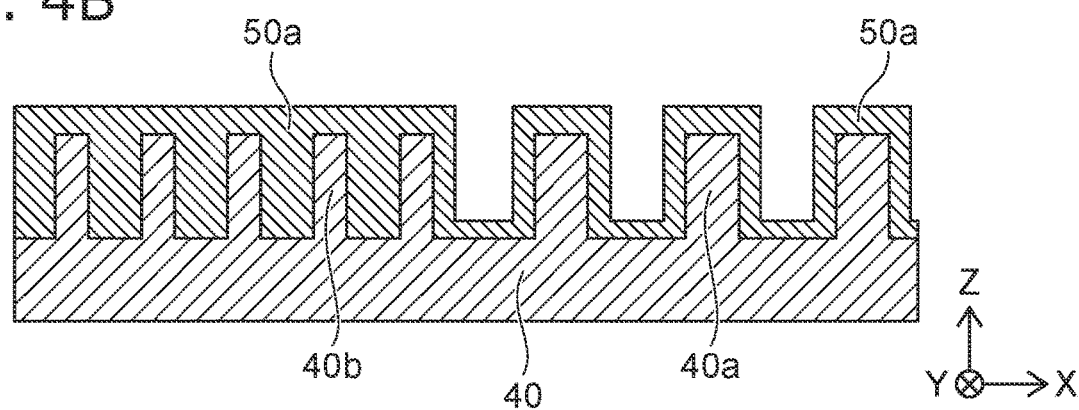
Figure 4C:
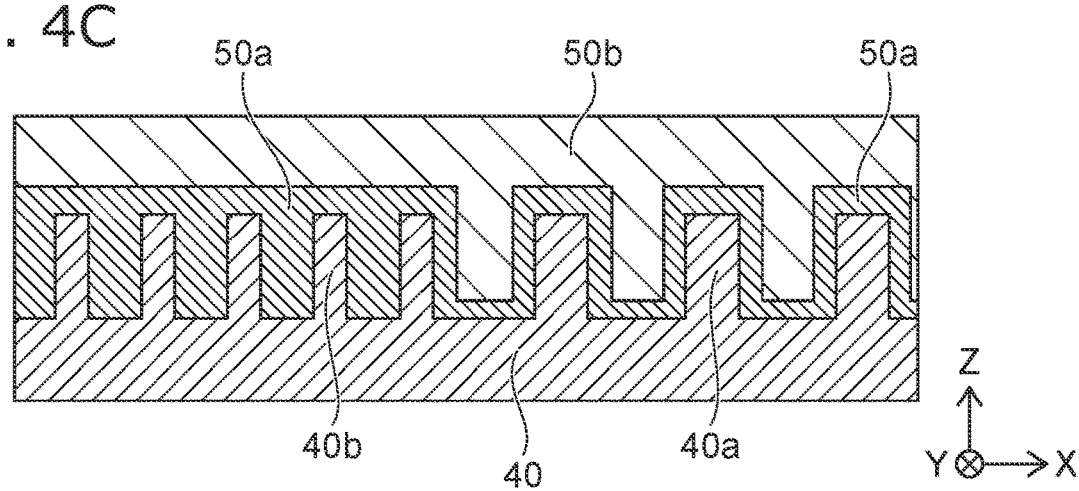

FIGS. 4A to 4C are schematic cross-sectional views showing manufacturing processes of the surface-emitting semiconductor light-emitting device 1 according to the embodiment. FIGS. 4A to 4C illustrate processes of forming the second semiconductor layer 50 on the photonic crystal layer 40.

As shown in FIG. 4A, an initial layer 50aa is formed to cover the protrusions 40a and 40b of the photonic crystal layer 40. The initial layer 50aa is formed using, for example, molecular beam epitaxy (MBE growth).

In MBE growth, a molecular beam (MB) is irradiated in, for example, a direction oblique to the Z-direction. The Z-direction is perpendicular to the photonic crystal layer 40. While the molecular beam is irradiated, for example, the photonic crystal layer 40 is rotated in the X-Y plane. Therefore, the initial layer 50aa is formed on the top portions and the side surfaces of the protrusions 40a and 40b. Also, the initial layer 50aa is formed on the bottom surfaces between the adjacent protrusions 40a and between the adjacent protrusions 40b so that a space remains therebetween.

As shown in FIG. 4B, the first layer 50a is formed by continuing the MBE growth to increase the layer thickness of the initial layer 50aa. The first layer 50a is formed to cover the multiple protrusions 40a so that the space remains between the adjacent protrusions 40a. On the other hand, the first layer 50a is formed to cover the multiple protrusions 40b so that the space between the adjacent protrusions 40b is filled with the first layer 50a. In the first layer 50a, for example, the X-direction width of the filled portion between the adjacent protrusions 40b is equal to the spacing DL of the adjacent protrusions 40b.

As shown in FIG. 4C, the second layer 50b is formed on the first layer 50a. The second layer 50b is formed using, for example, the MBE growth. The second layer 50b is doped with the first-conductivity-type impurity. The concentration of the first-conductivity-type impurity in the first layer 50b is higher than a concentration of the first-conductivity-type impurity in the first layer 50a. The second layer 50b is formed to have a thickness sufficient to fill the space between the adjacent protrusions 40a.

Figure 5:
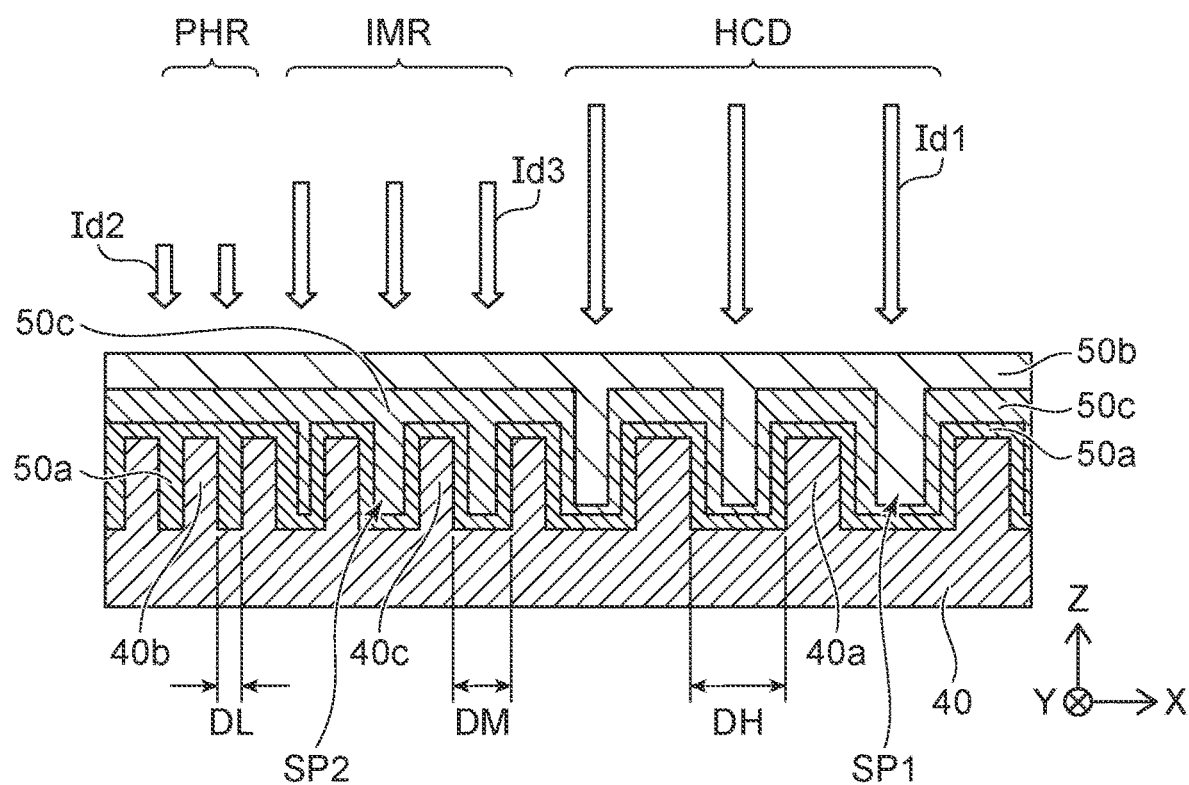
FIG. 5 is a schematic cross-sectional view showing a photonic crystal layer of a surface-emitting semiconductor light-emitting device according to a modification of the embodiment.

FIG. 5 is a schematic cross-sectional view showing the photonic crystal layer 40 of a surface-emitting semiconductor light-emitting device 2 according to a modification of the embodiment. In FIG. 5, the arrows represent the currents Id1 to Id3 flowing through the photonic crystal layer 40, and the lengths of the allows correspond to the relative magnitudes of the currents Id1 to Id3, respectively.

As shown in FIG. 5, the photonic crystal layer 40 includes the protrusion 40a, the protrusion 40b, and a protrusion 40c. The protrusion 40a is provided in the high current density region HCD. The protrusion 40b is provided in the peripheral region PHR. The protrusion 40c is provided in an intermediate region IMR. The intermediate region IMR is provided between the high current density region HCD and the peripheral region PHR. The intermediate region IMR surrounds the high current density region HCD.

In the intermediate region IMR, a spacing DM of the protrusions 40c adjacent to each other in the X-direction among the multiple protrusions 40c is, for example, less than the spacing DH of the adjacent protrusions 40a and greater than the spacing DL of the adjacent protrusions 40b. The spacing DM in the intermediate region IMR is, for example, the minimum spacing of the adjacent protrusions 40c.

The second semiconductor layer 50 includes the first layer 50a, the second layer 50b, and a third layer 50c. The third layer 50c is provided between the first layer 50a and the second layer 50b. The first layer 50a, the second layer 50b, and the third layer 50c include the same material, e.g., InP.

The third layer 50c includes a first-conductivity-type impurity with a higher concentration than the concentration of the first-conductivity-type impurity in the first layer 50a. The second layer 50b includes the first-conductivity-type impurity with a higher concentration than the concentration of the first-conductivity-type impurity in the third layer 50c. The concentration of the first-conductivity-type impurity in the first layer 50a is, for example, less than $1 \times 10^{15}$ cm$^{-3}$. The concentration of the first-conductivity-type impurity in the second layer 50b is, for example, not less than $1 \times 10^{17}$ cm$^{-3}$. The concentration of the first-conductivity-type impurity in the third layer 50c is, for example, not less than $1 \times 10^{15}$ cm$^{-3}$ but less than $1 \times 10^{16}$ cm$^{-3}$.

The first layer 50a covers the multiple protrusions 40a so that a first space SP1 remains between the adjacent protrusions 40a in the high current density region HCD. Also, the first layer 50a covers the multiple protrusions 40c so that a second space SP2 remains between the adjacent protrusions 40c in the intermediate region IMR. The first layer 50a covers the multiple protrusions 40b, and the space between the adjacent protrusions 40b is filled with a portion of the first layer 50a. The first layer 50a includes the filled portion that has the same X-direction width as the spacing DL of the adjacent protrusions 40b.

The third layer 50c is provided on the first layer 50a. The third layer 50c covers the multiple protrusions 40a so that the first space SP1 remains between the adjacent protrusions 40a in the high current density region HCD. Also, the third layer 50c covers the multiple protrusions 40b and the multiple protrusions 40c, and the second space SP2 between the adjacent protrusions 40c is filled with the third layer 50c in the intermediate region IMR.

The second layer 50b is provided on the third layer 50c. The second layer 50b covers the multiple protrusions 40a, the multiple protrusions 40b, and the multiple protrusions 40b. The first space SP1 between the adjacent protrusions 40a is filled with the second layer 50b in the high current density region HCD.

In the surface-emitting semiconductor light-emitting device 2, the currents Id1 to Id3 flows through the photonic crystal layer 40. The current Id1 flows in the high current density region HCD and flows mainly through a portion of the second layer 50b between the adjacent protrusions 40a. The current density of the current Id1 is greater than the current densities of the current Id2 flowing in the peripheral region PHR and the current Id3 flowing in the intermediate region IMR. Because a portion of the third layer 50c is provided between the adjacent protrusions 40c; and the portion of the first layer 50a is provided between the adjacent protrusions 40b, the electrical resistance of the current path in the intermediate region IMR is less than the electrical resistance of the current path in the peripheral region PHR. Therefore, the current density of the current Id3 in the intermediate region IMR is greater than the current density of the current Id2 in the peripheral region PHR.

Thus, in the surface-emitting semiconductor light-emitting device 2, the current injection provides the different carrier density in the high current density region HCD, the peripheral region PHR and the intermediate region IMR. The imaginary part of the complex refractive index is changed thereby, and the Q-factor of the optical resonance can be increased in the active layer 30. In other words, the intensity of the laser light radiated from the active layer 30 can be increased.

In the embodiments described above, the first layer 50a and the second layer 50b of the second semiconductor layer 50 are provided with the same material, but the material of the second layer 50b may be different from the material of the first layer 50a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A surface-emitting semiconductor light-emitting device, comprising:
   a first semiconductor layer of a first conductivity type;
   an active layer provided on the first semiconductor layer;
   a photonic crystal layer provided on the active layer, the photonic crystal layer including a first region and a second region surrounding the first region, the photonic crystal layer including a plurality of protrusions arranged along an upper surface of the active layer, the plurality of protrusions including a plurality of first protrusions in the first region and a plurality of second protrusions in the second region, a first spacing of adjacent first protrusions among the plurality of first protrusions being greater than a second spacing of adjacent second protrusions among the plurality of second protrusions; and
   a second semiconductor layer provided on the photonic crystal layer, the second semiconductor layer being of the first conductivity type, the second semiconductor layer including a first layer and a second layer on the first layer, a first-conductivity-type impurity concentration in the first layer being less than a first-conductivity-type impurity concentration in the second layer, the first layer covering the plurality of protrusions, the first layer covering the plurality of first protrusions so that a first space remains between the adjacent first protrusions, the first layer including a first portion provided between the adjacent second protrusions, the first portion of the first layer having a width in a first direction along the upper surface of the active layer, the width of the first portion being same as the second spacing between the second protrusions adjacent in the first direction, the second layer including a second portion provided between the adjacent first protrusions, the first space between the adjacent first protrusions being filled with the second portion of the second layer.

2. The device according to claim 1, wherein
the second layer of the second semiconductor layer includes the second portion extending between the plurality of first protrusions, and does not extend between the plurality of second protrusions.

3. The device according to claim 1, wherein
the plurality of second protrusions is arranged at uniform spacing in the first direction and a second direction, the second direction being directed along the upper surface of the active layer and orthogonal to the first direction.

4. The device according to claim 3, wherein
the first portion of the first layer has a width in a diagonal direction, the diagonal direction being directed along the upper surface of the active layer and crossing the first and second directions, and
the width in the diagonal direction of the first portion is same as a spacing between second protrusions adjacent in the diagonal direction among the plurality of second protrusions.

5. The device according to claim 1, wherein
the photonic crystal layer further includes a third region provided between the first region and the second region,
the plurality of protrusions further includes a plurality of third protrusions provided in the third region,
a third spacing between adjacent third protrusions among the plurality of third protrusions is less than the first spacing of the adjacent first protrusions and greater than the second spacing of the adjacent second protrusions, and
the first layer of the second semiconductor layer covers the plurality of third protrusions so that a second space remains between the adjacent third protrusions.

6. The device according to claim 5, wherein
the second semiconductor layer further includes a third layer provided between the first layer and the second layer,
the third layer includes a first-conductivity-type impurity with a higher concentration than the concentration of first-conductivity-type impurity in the first layer and with a lower concentration than the concentration of first-conductivity-type impurity in the second layer,
the third layer covers the plurality of first protrusions so that the first space remains between the adjacent first protrusions, and
the third layer includes a third portion provided between the adjacent third protrusions, the second space between the adjacent third protrusions being filled with the third portion of the third layer, the portion of the third layer having a width equal to a width of the second space between the adjacent third protrusions.

7. The device according to claim 6, wherein
the second layer of the second semiconductor layer includes the second portion extending between the plurality of first protrusions, and does not extend between the plurality of second protrusions and between the plurality of third protrusions.

8. The device according to claim 1, wherein
the first protrusion and the second protrusion have circular columnar or triangular prism shapes.

9. The device according to claim 1, wherein
the first spacing of the adjacent first protrusions is less than a height of the plurality of first protrusions in a third direction perpendicular to the upper surface of the active layer.

10. The device according to claim 9, wherein
a height in the third direction of the plurality of second protrusions is equal to the height of the third direction of the plurality of first protrusions.

11. The device according to claim 9, wherein
the photonic crystal layer has a layer thickness in the third direction that is greater than the height in the third direction of the plurality of first protrusions.

12. The device according to claim 1, wherein
the first spacing of the adjacent first protrusions is 0.1 to 0.5 micrometers, and
a height of the plurality of first protrusions in a direction perpendicular to the upper surface of the active layer is 0.8 to 2.0 micrometers.

13. The device according to claim 1, wherein
the plurality of first protrusions is arranged at a periodicity to convert a propagation direction of light propagating in a direction along the upper surface of the active layer into a direction crossing the upper surface of the active layer.

14. The device according to claim 1, wherein
the active layer includes a quantum well structure that provides intersubband transitions of electrons.

15. The device according to claim 14, wherein
the active layer includes a quantum well structure that includes an InGaAs crystal and an AlInAs crystal.

16. The device according to claim 1, further comprising:
a semiconductor substrate of the first conductivity type,
the first semiconductor layer being provided between the semiconductor substrate and the active layer.

17. The device according to claim 16, further comprising:
a first electrode provided on a back surface of the semiconductor substrate at a side opposite to the first semiconductor layer; and
a second electrode provided on the second semiconductor layer.

18. The device according to claim 17, wherein
the second electrode includes a material reflecting light radiated from the active layer, and
the first electrode surrounds the first region of the photonic crystal layer in a plan view parallel to the back surface of the semiconductor substrate.

19. The device according to claim 18, wherein
a mesa structure is provided on the semiconductor substrate,
the mesa structure includes the active layer, the photonic crystal layer, and the second semiconductor layer, and
the second electrode extends onto a side surface of the mesa structure with an insulating film interposed.

20. The device according to claim 17, further comprising:
a third semiconductor layer provided between the second semiconductor layer and the second electrode, the third semiconductor layer being of the first conductivity type, the third semiconductor layer having a narrower energy bandgap than the second semiconductor layer.

* * * * *